United States Patent [19]

Muro

[11] Patent Number: 5,013,904
[45] Date of Patent: May 7, 1991

[54] INTEGRATED PHOTODETECTOR WITH HYSTERESIS

[75] Inventor: Hideo Muro, Yokohama, Japan

[73] Assignee: Nissan Motor Co., Ltd., Yokogama, Japan

[21] Appl. No.: 267,946

[22] Filed: Nov. 7, 1988

[30] Foreign Application Priority Data

Nov. 5, 1987 [JP] Japan .................. 62-169601

[51] Int. Cl.$^5$ .................................. H01J 40/14
[52] U.S. Cl. ......................... 250/214 R; 307/311
[58] Field of Search ............ 250/211 J, 214 R, 578, 250/214 AL; 307/311; 357/30

[56] References Cited

U.S. PATENT DOCUMENTS

| | | | |
|---|---|---|---|
| 3,704,376 | 11/1972 | Lehovec et al. | 250/211 J |
| 3,717,770 | 2/1973 | Dyck et al. | 250/211 J |
| 3,770,967 | 11/1973 | Hanna et al. | 250/211 J |
| 3,770,968 | 11/1973 | Hession | 250/211 J |
| 4,556,789 | 12/1985 | Shotaro et al. | 250/214 R |
| 4,658,129 | 4/1987 | Fan | 250/214 R |
| 4,745,274 | 5/1988 | Muro | 250/214 R |

*Primary Examiner*—David C. Nelms
*Assistant Examiner*—Stephone B. Allen
*Attorney, Agent, or Firm*—Foley & Lardner

[57] ABSTRACT

A single-chip integrated photodetector including a photodiode for detecting intensity of light and a photo-device for detecting the intensity of the light, which are connected in series, in which ON- and OFF-levels of the photo-device are determined by trigger level and holding current thereof. A current source device having hysteresis characteristics may be also connected to a photodiode, in series, instead of a photo-device to output first or second determined current values when a voltage applied from the photodiode is lower or higher than a certain voltage.

7 Claims, 4 Drawing Sheets

INTEGRATED PHOTODETECTOR WITH HYSTERESIS

BACKGROUND OF THE INVENTION

1. Field of the Invention

The present invention relates to a single-chip integrated photodetector including a photodiode and a signal processing circuit, or an optical IC.

2. Description of the Prior Art

In FIGS. 1 and 2, there is shown a conventional optical IC including a photodiode 1, an amplifier 2 for amplifying an output signal of the photodiode 1, a Schmitt-trigger circuit 3 for conducing an On-Off control of the amplified signal, an output transistor 4 driven by the Schmitt-trigger circuit 3, a load resistor 5 and a stabilized power source 6. An emitter of the transistor 4 is coupled to the ground GND, and a collector of the transistor 4 is connected to a voltage output terminal $V_{out}$ and to a power source $V_{CC}$ via the resistor 5. FIG. 2 shows a cross section of the single-chip optical IC shown in FIG. 1, including three portions of the photodiode 1, an NPN transistor 7 for the output transistor 4 and a base diffusion resistor 8 for the load resistor 5.

As shown in FIG. 2, in a P-type silicon substrate 9, two n+-type buried layers 10 are formed in the left and right side intermediate portions, and three n−-type epitaxial layers 11 are grown in the central surface portion and the left and right side surface portions on the n+-type buried layers 10 in the above described three portions of the photodiode 1, the NPN transistor 7 and the base diffusion resistor 8. Two P-type base diffusion regions 12 are formed in the surface portions of the two left and right n−-type epitaxial layers 11, respectively, and three n+-type emitter diffusion regions 13 are formed in the surface portions of the left P-type base diffusion region 12, the right side portion of the left n−-type epitaxial layer 11, and the right side portion of the central n−-type epitaxial layer 11, respectively. An insulating oxide film 14 covers over the surface of the P-type silicon substrate 9. Metallic wirings 15 made of a material such as aluminum are attached to the P-type base diffusion region 12 and two n+-type emitter diffusion regions 13 of the P-type base diffusion region 12 and the n−-type epitaxial layer 11, as a base B, an emitter E and a collector C, respectively, through the oxide film 14 in the NPN transistor 7, are attached to the n+-type emitter diffusion region 13 and the surface of the P-type silicon substrate 9 as a cathode K and an anode A, respectively, through the oxide film 14 in the photodiode 1, and are attached to the left and right side ends of the P-type base diffusion region 12 as terminals $R_1$ and $R_2$, respectively, through the oxide film 14 in the base diffusion resistor 8.

In the above described above, the PN junction between the P-type silicon substrate 9 and the n−-type epitaxial layer 11 constitutes the photodiode 1 having the anode A of the P-type silicon substrate 9 in the central portion, and the n−-type epitaxial layer 11, the P-type base diffusion region 12 and the n+-type emitter diffusion region 13 constitute the NPN transistor 4 in the left side portion 7. The P-type base diffusion region 12 forms the resistor 5 in the right side portion 8.

In this embodiment, when the light L shines on the photodiode 1 while photodiode 1 is reverse-biased, a small photo-current flows therein, and the small current is converted into a voltage in the amplifier 2. Then, the voltage is fed from the amplifier 2 to the Schmitt-trigger circuit 3. The Schmitt-trigger circuit 3 has the hysteresis such that it is switched on when an input voltage becomes beyond a certain value, and, in turn, is switched off when the input voltage is below the certain value. The output signal of the Schmitt-trigger circuit 3 drives the output transistor 4, and the output signal is picked up outside from the output transistor 4. That is, a signal having a value "0" or "1" which is determined by comparing the intensity of the irradiated light with a certain reference value, is outputted from the output transistor 4 with a certain hysteresis.

However, in the conventional optical IC, since the detector part for detecting the light current of the photo-transistor 1 is composed of the amplifier 2 and the Schmitt-trigger circuit 3, the number of the elements is large, and thus their occupying area becomes wide or the chip size becomes large. Further, since the detection of the light current of the photodiode 1 is performed by comparing with the reference voltage after conducting its voltage conversion, there are many error factors and a large dispersion in its sensitivity as well as a large temperature dependence.

SUMMARY OF THE INVENTION

Accordingly, it is an object of the present invention to provide a single-chip integrated photodetector, free from the aforementioned defects and disadvantages of the prior art, which is capable of improving accuracy, sensitivity and temperature dependence and reducing error factors and electricity consumption, and which is small in size and simple in structure.

In accordance with one aspect of the present invention, there is provided a single-chip integrated photodetector, comprising photodiode means for detecting intensity of light, photo-device means for detecting the intensity of the light, the photodiode means and the photo-device means being connected in series in an integrated form on a single-chip, ON-level and OFF-level of the photo-device means being determined by trigger level and retentive current, respectively, thereof.

In accordance with another aspect of the present invention, there is provided a single-chip integrated photodetector, comprising photodiode means for detecting intensity of light, current source device means having hysteresis characteristics to output a first determined current value when a voltage applied from the photodiode means is lower than a certain voltage and a second determined current value when the applied voltage is higher than the certain voltage, the photodiode means and the current source device means being connected in series in an integrated form on a single-chip.

DESCRIPTION OF THE PREFERRED EMBODIMENTS

Figure 3:
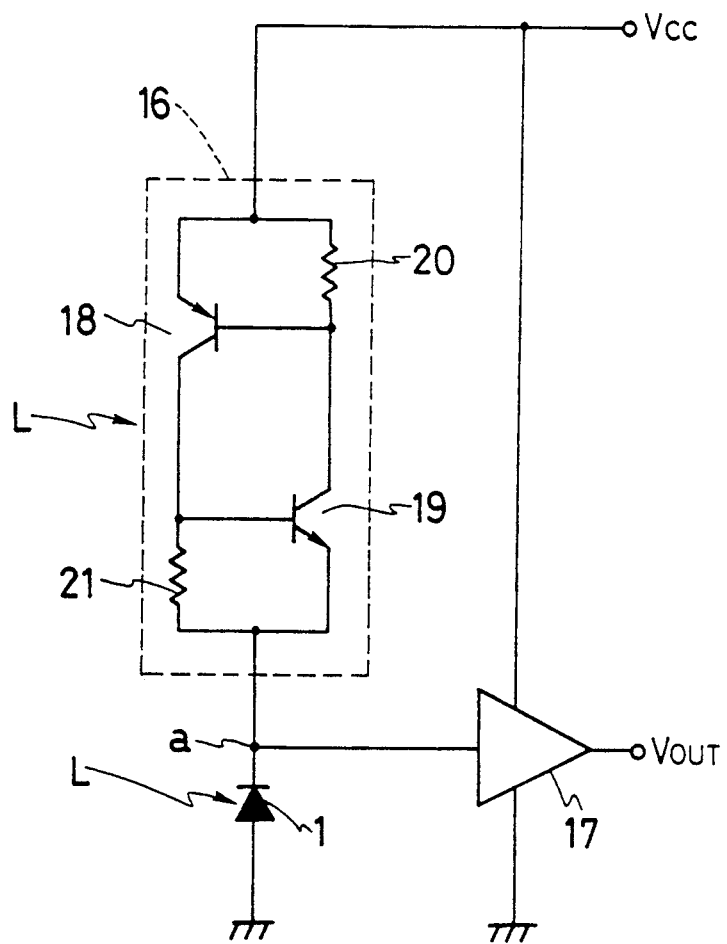
FIG. 3 is a circuit diagram of a first embodiment of a single-chip integrated photodetector according to the present invention.
Figure 2:
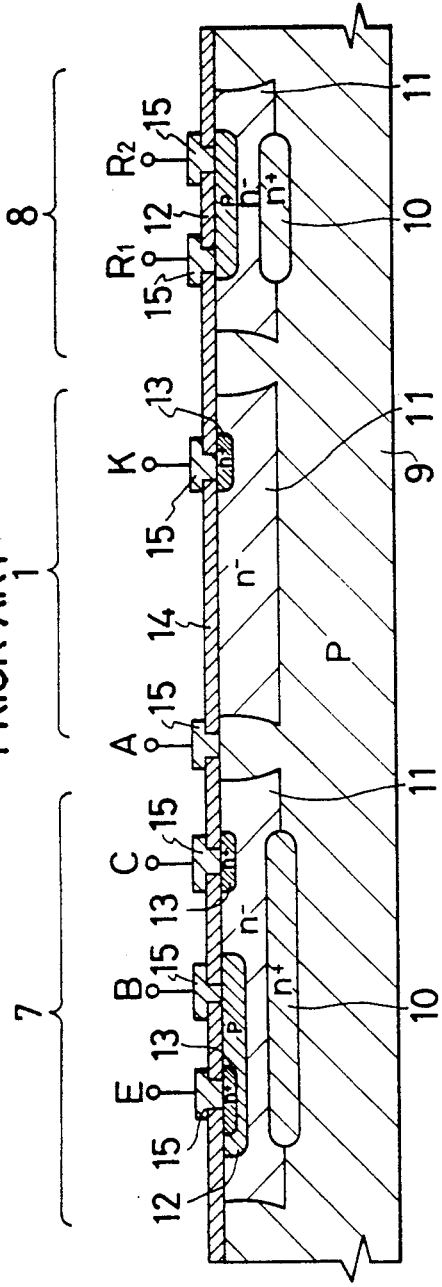
FIG. 2 is a cross sectional view of an essential part of the single-chip device shown in FIG. 1.
Figure 4:
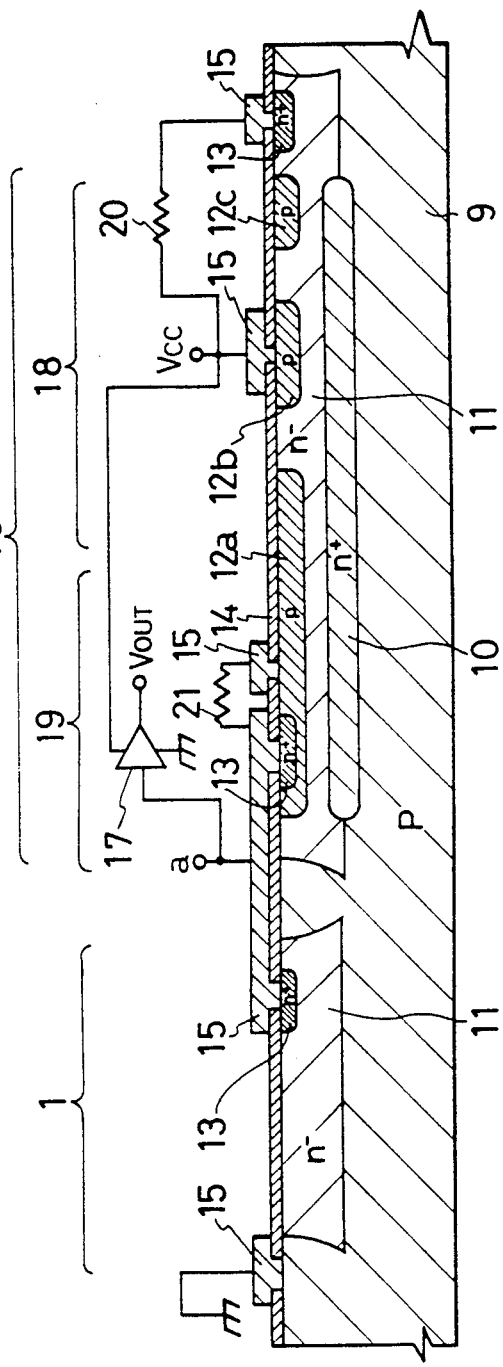
FIG. 4 is a cross sectional view of the single-chip integrated photodetector shown in FIG. 3.

Referring now to the drawings, wherein the same members as those of the conventional one designate the same reference characters and their description may be omitted for the brevity of the explanation, there is shown in FIGS. 3 and 4 the first embodiment of a single-chip integrated photodetector according to the present invention.

In the drawings, the photodetector comprises a photodiode 1, a photo-thyristor 16 and an impedance converter 17. The anode and cathode of the photodiode 1 are connected to the ground GND and a cathode of the photo-thyristor 16, respectively. The contact point a of the cathodes of the photodiode 1 and the photo-thyristor 16 is connected to an input terminal of the impedance converter 17, and an output terminal of the impedance converter 17 leads to a voltage output terminal $V_{out}$. An anode of the photo-thyristor 16 is linked to a positive power source $V_{CC}$.

Figure 1:
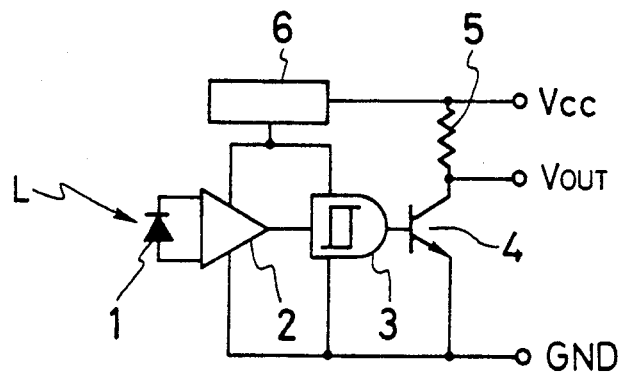
FIG. 1 is a circuit diagram of a conventional integrated photodetector.

In this embodiment, although the output transistor 4 and the stabilized power source 6 of the conventional device shown in FIG. 1 are used in practice, however, these members will be omitted from the figures and the following description for the brevity.

The photo-thyristor 16 includes a PNP transistor 18, an NPN transistor 19 and two resistors 20 and 21 which connect the emitters and bases of the transistors 18 and 19, respectively, the bases of the transistors 18 and 19 are coupled to the collectors of the other transistors 19 and 18.

In FIG. 4, there is shown a single-chip device including the photodiode 1 and the photo-thyristor 16. In a P-type silicon substrate 9, an n+-type buried layer 10 is formed in the right side intermediate portion, and two n−-type epitaxial layers 11 are grown in the left surface portion and the right surface portion over the n+-type buried layer 10. Three P-type base diffusion regions 12a, 12b and 12c having different surface areas from one another are separately formed in the surface area of the right side n−-type epitaxial layer 11, and three n+-type emitter diffusion regions 13 are formed in the surface portions of the right side portion of the left side n−-type epitaxial layer 11, the left side end portions of the left P-type base diffusion region 12a and the right side end portion of the right n−-type epitaxial layer 11. An insulating oxide film 14 covers over the surface of the P-type silicon substrate 9, and metallic wirings 15 made of a material such as aluminum are attached to the P-type silicon substrate 9, the three n+-type emitter diffusion regions 13 and the two P-type base diffusion regions 12a and 12b through the oxide film 14.

The resistor 20 is connected between the middle P-type base diffusion region 12b and the n+-type emitter diffusion region 13 of the right side n−-type epitaxial layer 11 via the wirings 15, and the resistor 21 couples the left side P-type base diffusion region 12a and the n+-type emitter diffusion region 13 thereof through the wirings 15. The n+-type emitter diffusion regions 13 of the left side n−-type epitaxial layer 11 and the left side P-type base diffusion region 12a of the right side n−-type epitaxial layer 11 are linked through the wiring 15 which is connected to the point a and the input terminal of the impedance converter 17. The middle P-type base diffusion region 12b leads to the power source $V_{CC}$.

In the left side, as shown in FIG. 4, the photodiode 1 with its anode of the P-type silicon substrate 9 is formed by using the PN junction between the P-type silicon substrate 9 and the n−-type epitaxial layer 11. In the right side in FIG. 4, the photo-thyristor 16 is formed. The P-type base diffusion regions 12a and 12c, the right side n−-type epitaxial layer 11 and the middle P-type base diffusion region 12b as respective collector, base and emitter constitute the PNP transistor 18, and the right side n−-type epitaxial layer 11, the left side P-type base diffusion region 12a thereof and the n+-type emitter diffusion region 13 as respective collector, base and emitter constitute the NPN transistor 19 of FIG. 3. In this case, the P-type base diffusion region 12a is used in common for the collector and the base of the respective transistors 18 and 19, and the n−-type epitaxial layer 11 is used in common for the base and the collector of the same.

Figure 5:
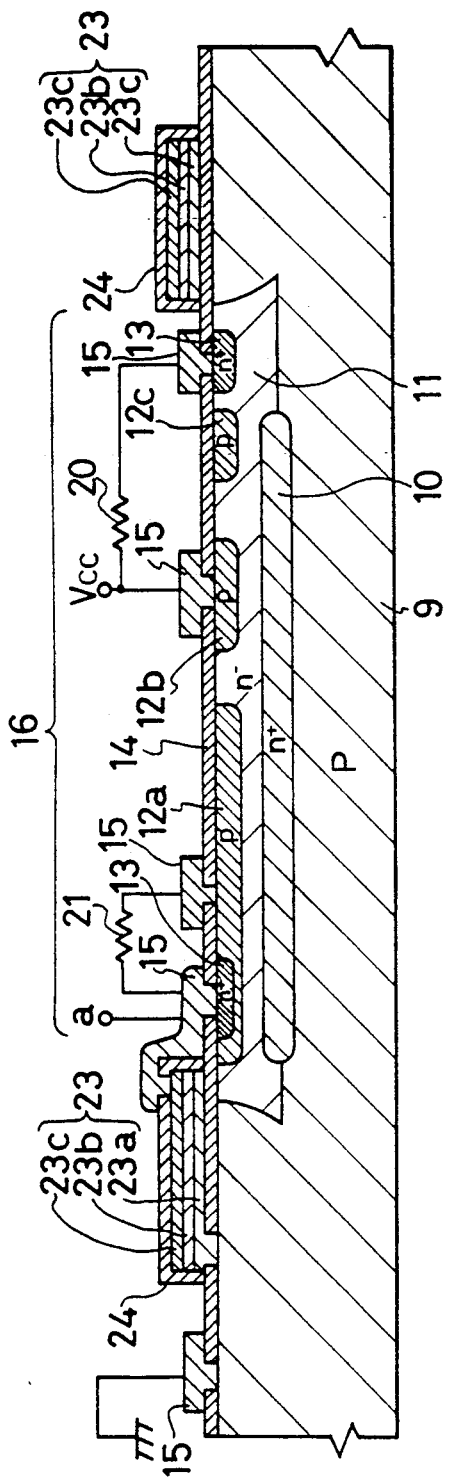
FIG. 5 is a cross sectional view of a second embodiment of a single-chip integrated photodetector according to the present invention.

In FIG. 5, there is shown the second embodiment of the single-chip integrated photodetector according to the present invention, having the same construction as that of the first embodiment shown in FIG. 4, except that a polycrystalline silicon-pin photodiode 23 is formed on the oxide film 14 instead of the photodiode 1 shown in FIG. 4. The polycrystalline silicon-pin photodiode 23 circles the photo-thyristor 16 and comprises a three film layer lamination, i.e., a lower positive film layer (p-layer) 23a, a middle intrinsic film layer (i-layer) 23b and an upper negative film layer (n-layer) 23c, which are covered by an insulating film 24. The lower p-layer 23a is directly contacted with a P−-type isolation region (not designated) in the surface area of the P-type silicon substrate 9 through the oxide film 14, and the upper n-layer 23c is electrically connected to the n+-type emitter diffusion region 13 of the left side P-type base diffusion region 12a via the metallic wiring 15 passing through a contact hole formed in the insulating film 24. In this embodiment, instead of the polycrystalline silicon films, amorphous silicon films may be used, and the lower p-layer 23a may be provided with a metallic wiring for a connection terminal.

In the preferred device shown in FIG. 5, since the photo-thyristor for detecting the light, surrounded by the polycrystalline silicon-pin photodiode 23 is realized in the form of a single island, the chip size can be further reduced.

In the above described optical IC devices, when the light L is irradiated to the photodiode 1 and the photo-thyristor 16 but the intensity of the light L is weak, the photo-thyristor 16 is still switched off, and no photo-current flows therein to keep the voltage at the point a to a low "L" level. In turn, when the intensity of the light L becomes strong, the photo-thyristor 16 is switched on, and the voltage at the point a rapidly increases to a high "H" level. At this time, the current flowing in the photo-thyristor 16 is the photo-current of the photodiode 1 in proportion to the intensity of the irradiated light L. That is, when the light to the photo-thyristor 16 rises to a trigger level therefor, the photo-thyristor 16 is switched on. Then, as the intensity of the light L gradually decreases, the current flowing in the photodiode 1 is gradually reduced in proportion to the decreasing light intensity. When the photo-current fails below the holding current for the photo-thyristor 16, the photo-thyristor 16 is switched off, and the voltage at the point a is changed again to "L" level.

As described above, the voltage at the point a is changed from "L" level to "H" level when the photo-thyristor 16 is switched on, and, when the photo-current is below the holding current of the photo-thyristor 16, the impedance converter 17 outputs the voltage with the similar hysteresis to that of the conventional one shown in FIG. 1 with respect to the intensity of the light until the voltage at the point a is changed from "H" level to "L" level. Therefore, according to the comparison of the light intensity and the reference value of the holding current of the photo-thyristor 16, the impedance converter 17 outputs the corresponding output signal "0" or "1".

The trigger light intensity or trigger level and the holding current of the photo-thrysitor 16 ar adjusted at will by varying the resistances of the resistors 20 and 21 and the sensitivity of the photodiode 1.

Figure 6:
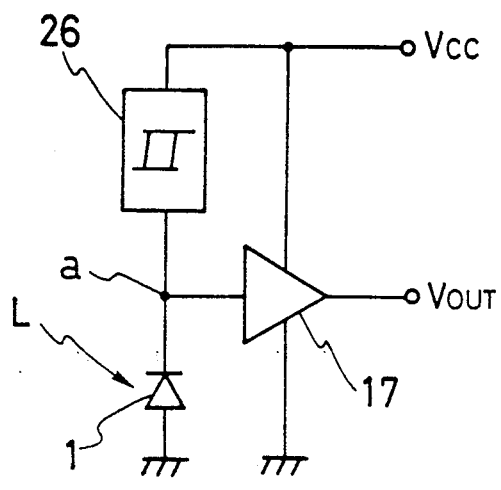
FIG. 6 is a circuit diagram of a third embodiment of a single-chip integrated photodetector according to the present invention.
Figure 7:
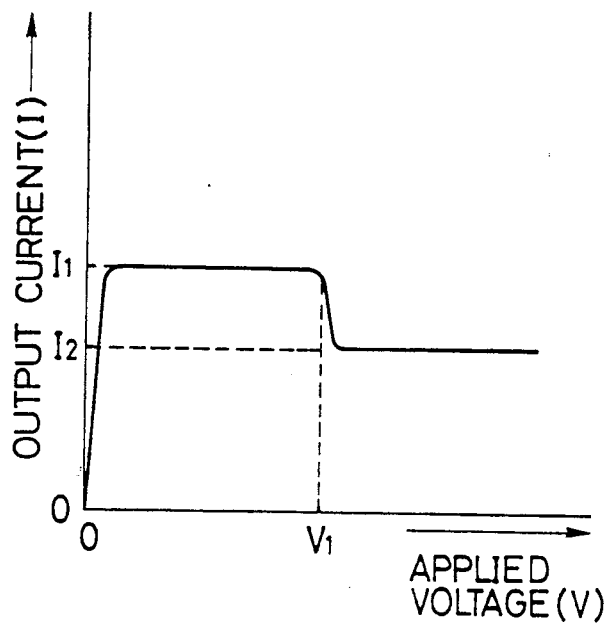
FIG. 7 is a graphical representation of characteristics of a current source element shown in FIG. 6.

In FIG. 6, there is shown the third embodiment of the single-chip integrated photodetector according to the present invention, having the same construction as that of the first embodiment, except a current source element 26 having voltage-current hysteresis characteristics shown in FIG. 7 instead of the photo-thyristor 16 of the first embodiment.

In FIG. 7, when an applied voltage V at the point a, which is given by the current of the photodiode 1, is below a certain voltage $V_1$, an output current I of the current source element 26 becomes a current $I_1$, and, when the applied voltage V at the point a is more than the voltage $V_1$, the output current I of the element 26 becomes a current I2 which is lower than the current $I_1$.

Figure 8:
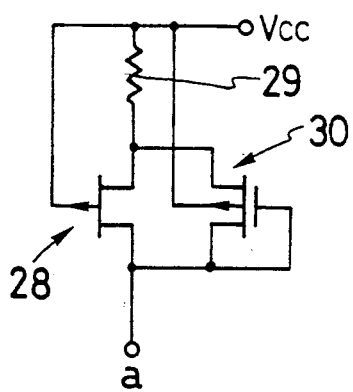
FIG. 8 is a circuit diagram of the current source element of FIG. 6.

In FIG. 8, there is shown one embodiment of the current source element 26 of FIG. 6, comprising a P-channel junction field effect transistor (JFET) 28, a resistor 29 connecting the gate and the source of the JFET 28, and a P-channel metal oxide semiconductor (MOS) transistor 30, in which the source of the MOS transistor 30 is connected to the source of the JFET 28, and the gate and the drain of the MOS transistor 30 is linked to the drain if the JFET 28.

In the circuit of FIG. 8, the drain current $I_{DS}$ of the JFET 28 is represented by an approximation of quadratic characteristics in the following equation, $$I_{DS} = I_{DSS}(1 - V_{GS}/V_P)^2 \quad (1)$$

wherein $I_{DSS}$ is a drain saturation current when $V_{GS}=0$, $V_P$ is a gate pinchoff voltage, and $V_{GS}$ is a voltage between the gate and source.

Then, the drain current $I_{DS}'$ of the MOS transistor 30 is also represented by an approximation of square characteristics in the following equation, $$I_{DS}' = (\beta/2)(V_{GS}' - V_{TH})^2 \quad (2)$$

wherein $\beta = \mu C o(W/L)$, $\mu$ is a mobility of a channel, Co is a gate capacity per unit area, W and L are width and length of the channel, $V_{GS}'$ is a voltage between the gate and source, and $V_{TH}$ is a threshold voltage, and wherein the voltage between the gate and drain of the MOS transistor 30 is always kept to be a saturation region because its gate and drain are connected to each other.

Now, when the applied voltage $V_0$ between both the ends of the current source element 26 is low and the MOS transistor 30 is OFF-state, the current Ip between both the ends of the current source element 26 becomes equal to the drain current $I_{DS}$ of the JFET 28. Hence, when $V_{GS}=R_0I_1$, wherein $R_0$ is the resistance of the resistor 29, is substituted in formula (1), the current $I_1$ is expressed in the following equation:

$$I_1 = (V_P/R_0)(1 + V_P/2R_0I_{DSS} - \sqrt{V_P/R_0I_{DSS} + V_P^2/4R_0^2I_{DSS}^2}) \quad (3)$$

Further, when the applied voltage $V_0$ increases to reach $V_{TH}+R_0I_1(=V_1)$, the MOS transistor 30 is changed to ON-state, and a positive feedback is applied to the MOS transistor 30 via the resistor 29. Hence, the output current is reduced to give a negative resistance. Further, when the current I2 in FIG. 7 is approximated by a convergent value of a low "L" level, the current I2 is represented in the following equation, $$I_2 = (V_P/R_0)\{(1 - R_0I_c/V_P) + V_P/2R_0I_{DSS} - \sqrt{(V_0 - R_0I_c)/R_0I_{DSS} + V_P^2/4R_0^2I_{DSS}^2}\} + I_c \quad (4)$$

wherein $I_c = (\beta/2)(V_{CC} - V_{TH})^2$.

Figure 9:
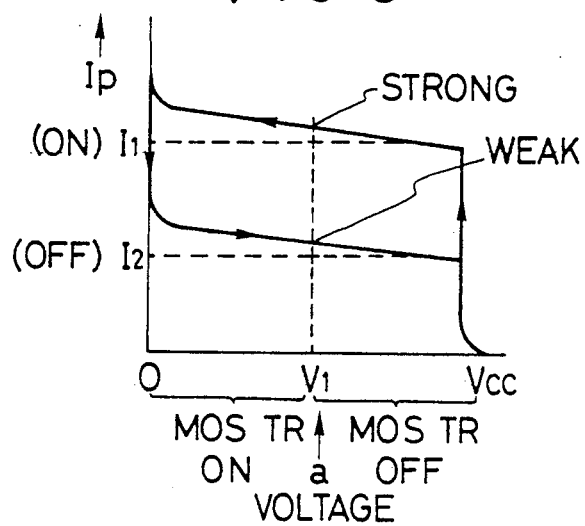
FIG. 9 is a graphical representation of current-voltage hysteresis at a point a of FIG. 8.

Therefore, the current source element 26 can provide a current source having the hysteresis shown in FIG. 9 by the ON and OFF of the MOS transistor 30.

Figure 10:
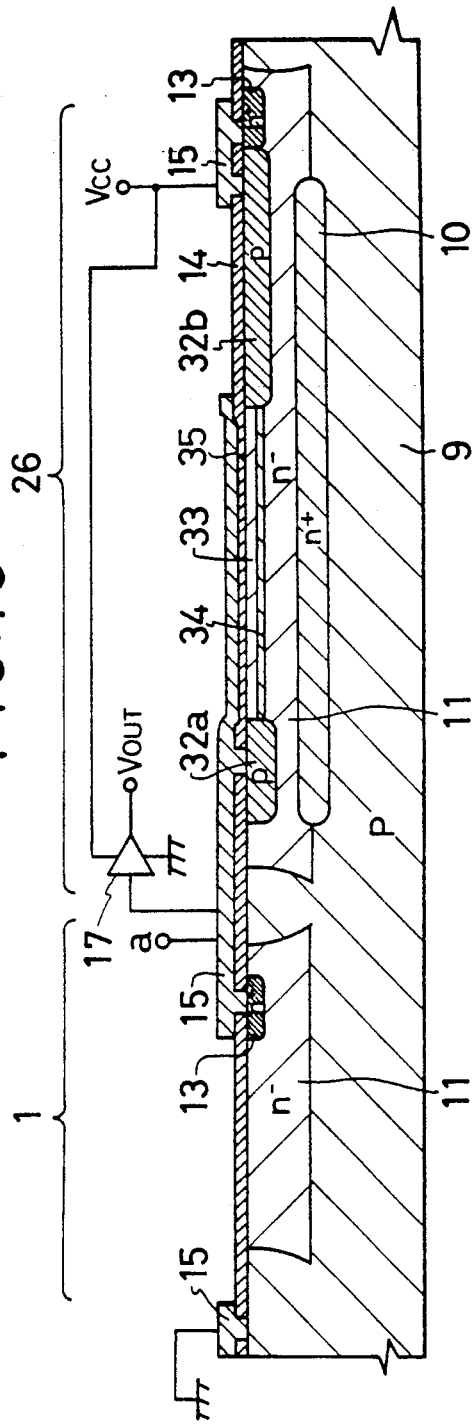
FIG. 10 is a cross sectional view of an essential part of the single-chip device of FIG. 6.

In FIG. 10, there is shown a single-chip device shown in FIGS. 6 and 8, including the photodiode 1 and the current source element 26, having the similar construction to that of the first embodiment shown in FIG. 4, except that two P-type base diffusion regions 32a and 32b are formed in the left and right side surface areas of the right side n⁻-type epitaxial layer 11, and are coupled to each other by an n⁻-type region for a P-channel 33 in the surface area, and another P-channel region 34 is formed just under the n⁻-type region 33 between the two P-type base diffusion regions 32a and 32b. The oxide film 35 positioned just over the n⁻-type region 33 functions as a gate oxide film, and the p-type base diffusion region 32b acts as the resistor 29. The n⁻-type region 33 just under the oxide film 35 is used for the channel of the MOS transistor 30, and the P-channel region 34 just under the n⁻-type region 33 is employed for the channel of the JFET 28. The P-type base diffusion region 32a and 32b are used in common as the drain and source for the MOS transistor 30 and the JFET 28, respectively.

In the single-chip device shown in FIGS. 6 to 10, when the light L is irradiated to the photodiode 1 but its intensity is weak, the photo-current IP is smaller than the ON current $I_1$ of the current source element 26, and the voltage at the point a is still in "H" level. When the light intensity becomes strong and the photo-current Ip increases to be larger than the ON current $I_1$ of the current source element 26, the voltage at the point a quickly falls down. Then, when the voltage at the point a becomes lower than the voltage $V_1$ in FIG. 7, the positive feedback functions, and thus the voltage converges to "L" level.

In turn, as the light intensity weakens, the light current $I_P$ of the photodiode 1 is reduced in proportion to the weakening light intensity, and, when the the light current $I_P$ becomes lower than the OFF current $I_2$ of the current source element 26, the voltage at the point a rapidly rises. When the voltage reaches the voltage $V_1$, the positive feedback is given, and the voltage goes up at a stretch to "H" level, i.e., the voltage $V_{CC}$.

As described above, in accordance with the comparison between the photo-current at the point a corresponding to the light intensity and the current of the current source element 26, the impedance converter 17 outputs the corresponding output signal "0" or "1".

As described above, according to the present invention, since the photodiode and the photodetecting device are formed in series in the integrated form on the single-chip and the output signal is picked up from the contact point of these two members, the number of the components is reduced to minimize the chip size as well as to reduce error factors, and, since the voltage conversion is not performed, the dispersion of the sensitivity and the temperature dependence can be improved. Further, when the device is in the OFF state, no current flows except the leak current, and the standby current can be substantially naught to reduce the electricity consumption.

What is claimed is:

1. An integrated photodetector with hysteresis, comprising:
   a photodiode means for detecting the intensity of light; and
   optically controlled switch means switched on or off by the light, the photodiode means and the optically controlled switch means being integrated on a single chip, the optically controlled switch means connected in series to a power source and to the photodiode means at a connection point, the ON-level and OFF-level of the optically controlled switch means being determined by trigger level and holding current, respectively, thereof, to output one of low and high level signals from the connection point according to a comparison result between the intensity of the light and the trigger level/holding current.

2. The photodetector of claim 1, also including circuit means connected to the connection point for impedance conversion.

3. The photodetector of claim 1, wherein the optically controlled switch means includes PNP transistor means, NPN transistor means and first and second resistor means for connecting emitters and bases of the respective transistor means, the bases of the transistor means being connected to the collectors of the counterpart transistor means.

4. The photodetector of claim 3, wherein the trigger level and the holding current of the optically controlled switch means and adjusted by varying the resistances of the first and second resistors and the sensitivity of the photodiode means.

5. An integrated photodetector with hysteresis, comprising:
   photodiode means for detecting the intensity of light; and
   current source device means having hysteresis characteristics to output a first current value when a voltage applied from the photodiode means is lower than a predetermined voltage and a second current value when the applied voltage is higher than the predetermined voltage, the photodiode means and the current source device means being integrated on a single chip, the current source device means connected in series to a power source and to the photodiode means at a connection point, to output one of low and high level signals from the connection point according to whether the intensity of the light detected by the photodiode means becomes less or larger than a predetermined value.

6. The photodetector of claim 5, also including circuit means connected to the connection point for impedance conversion.

7. The photodetector of claim 5, wherein the current source device means includes JFET means and MOS means connected in parallel with each other, the source and gate of the MOS means being connected, and wherein ON and OFF states of the MOS means are controlled by the intensity of the light detected by the photodiode means to output one of low and high level signals from the connection point.

* * * * *